United States Patent
Heyne et al.

(10) Patent No.: US 7,391,245 B2
(45) Date of Patent: Jun. 24, 2008

(54) DELAY LOCKED LOOP AND METHOD FOR SETTING A DELAY CHAIN

(75) Inventors: Patrick Heyne, München (DE); Aaron Nygren, München (DE)

(73) Assignee: Infineon Technologies AG, Neubiberg (DE)

( * ) Notice: Subject to any disclaimer, the term of this patent is extended or adjusted under 35 U.S.C. 154(b) by 65 days.

(21) Appl. No.: 11/437,825

(22) Filed: May 22, 2006

(65) Prior Publication Data

US 2006/0273834 A1 Dec. 7, 2006

(30) Foreign Application Priority Data

May 20, 2005 (DE) .................. 10 2005 023 427

(51) Int. Cl.
*H03L 7/06* (2006.01)

(52) U.S. Cl. ..................... 327/158; 327/149

(58) Field of Classification Search ............. None
See application file for complete search history.

(56) References Cited

U.S. PATENT DOCUMENTS

| | | | |
|---|---|---|---|
| 5,321,369 A * | 6/1994 | Wolaver | 327/3 |
| 5,408,200 A * | 4/1995 | Buhler | 331/1 A |
| 6,388,482 B1 * | 5/2002 | Schnell et al. | 327/158 |
| 6,456,128 B1 * | 9/2002 | Nakamura | 327/149 |
| 6,667,643 B2 * | 12/2003 | Ko | 327/158 |
| 6,912,680 B1 * | 6/2005 | Keeth | 714/736 |
| 7,242,733 B2 * | 7/2007 | Iwata | 375/355 |
| 2003/0094984 A1 | 5/2003 | Weis et al. | |

FOREIGN PATENT DOCUMENTS

| | | |
|---|---|---|
| JP | 6268490 | 9/1994 |
| WO | WO 2004/107579 A2 | 12/2004 |

OTHER PUBLICATIONS

Lee, J.H, et al. "A 330MHz Low-Jitter and Fast-Locking Direct Skew Compensation DLL", 2000 IEEE International Solid-State Circuits Conference.
Kim, J.J., et al., "A Low-Jitter Mixed-Mode DLL for High-Speed DRAM Applications", IEEE Journal of Solid-State Circuits, vol. 35, No. 10, Oct. 2000.

* cited by examiner

*Primary Examiner*—Cassandra Cox
(74) *Attorney, Agent, or Firm*—Edell, Shapiro & Finnan, LLC (57) ABSTRACT

A delay locked loop includes a delay chain that contains a plurality of series-connected delay cells, a phase detector arrangement that contains a plurality of phase detector cells and a control unit. The delay locked loop delays an input signal by a delay time via the delay chain depending on the number of delay cells in the series that are activated for delay. The phase detector arrangement detects the phase of the signal at the output of each delay cell in the delay chain. The control unit activates a number Z of the delay cells of the delay chain based on the difference in phase of the original signal and the delayed signal.

29 Claims, 5 Drawing Sheets

DELAY LOCKED LOOP AND METHOD FOR SETTING A DELAY CHAIN

CROSS REFERENCE TO RELATED APPLICATIONS

This application claims priority under 35 U.S.C. §§119 and/or 365 to Application No. DE 102005023427.5 filed on May 20, 2005, entitled "Delay Locked Loop And Method For Setting A Delay Chain," the entire contents of which are hereby incorporated by reference.

FIELD OF THE INVENTION

The present invention relates to a delay locked loop and to a method for setting a delay chain.

BACKGROUND

A delay locked loop (DLL), is used in many cases for delaying a clock signal in integrated semiconductor circuits. Such a control loop is used in digitally operating circuits in order to bring clock signals into an identical phase angle.

This is the case in synchronously operated integrated semiconductor memories, e.g., in which data values are valid both upon the rising edge and upon the falling edge of a clock signal that validates the data. The semiconductor memories are referred to as double data rate synchronous dynamic random access memories, (DDR SDRAM). The DDR SDRAM includes a delay locked loop that provides data synchronously with an input clock signal for the component. From the input clock signal, it is necessary to generate an internal delayed signal that has a phase angle that makes it possible to provide data synchronously with the clock signal at the device terminals of the DDR SDRAM. The internal delay locked loop has to account for the internal signal propagation times.

A customary delay locked loop compares the input clock signal for the device with the delayed signal, generated by the delay locked loop, and sets the delay in a delay chain such that the phase difference is as far as possible regulated to zero. What is particularly important in this case is that the delayed signal generated is as stable and free of jitter as possible.

Typical operating frequencies for DDR SDRAMs are 500 megahertz. Known delay locked loops have a delay chain, a phase detector and a control unit and have the disadvantage that a relatively large number of clock cycles are required before the delay time of the delay chain is set. Since a DDR SDRAM can be used at different frequencies, the delay locked loop has to be designed flexibly such that a satisfactory synchronization of the phase angles is achieved for both the lower frequency values and the upper frequency values for which the DDR SDRAM is specified.

SUMMARY

The present invention provides a delay locked loop that can be set in a flexible manner. In accordance with one aspect, a delay locked loop includes: a delay chain with an input for feeding in an input signal, a first plurality of series-connected delay cells and an output at which a signal delayed by a delay time via the delay chain is made available and which is coupled to a first node at which a first signal is made available; a phase detector coupled to the first node at a first phase detector input and to the input of the delay chain at a second phase detector input and which has a phase detector output; a control unit coupled on the input side to the phase detector and on the output side to the delay chain in order to set the delay time of the delay chain; a phase detector arrangement having a second plurality of phase detector cells that are connected to the first node in each case at a first input and to an output of one of the delay cells of the delay chain in each case at a second input, the phase detector arrangement being coupled to the control unit and the control unit being designed for setting the delay time of the delay chain in such a way that a first number Z of the delay cells are activated for delay.

The delay locked loop includes the delay chain having the input, the first plurality of series-connected delay cells and the output. The input serves for forwarding the input signal. The signal delayed by a delay time via the delay chain is made available at the output. The output of the delay chain is coupled to the first node, at which the first signal is made available.

The delay locked loop furthermore has the phase detector comprising the first and second phase detector inputs and also the phase detector output. The first phase detector input is coupled to the first node. The second phase detector input is coupled to the input of the delay chain.

The delay locked loop furthermore has the control unit that is coupled to the phase detector output at an input. The control unit is furthermore connected at an output to the delay chain for setting the delay time of the delay chain.

The delay locked loop furthermore comprises the phase detector arrangement comprising the second plurality of phase detector cells. Each phase detector cell in each case has the first input connected to the first node, and the second input connected to the output of one of the delay cells of the delay chain.

The delay locked loop furthermore comprises the coupling of the phase detector arrangement to an input of the control unit. A signal present at the phase detector cells on the output side is forwarded to the control unit. The control unit is set up in such a way that it sets the delay time of the delay chain by virtue of the fact that the first number Z of the delay cells are connected such that they are used delay-effectively.

In accordance with this arrangement, the input signal passes through a number of the series-connected delay cells. With the aid of the phase detector cells which are associated with the phase detector arrangement and which are connected to the output of a respective delay cell, it is possible to determine the phase angle of the input signal passing through the delay chain with respect to a phase angle of the first signal, which can be tapped off at the first node. In this case, the first node is coupled to the output of the delay chain.

Due to the flow of information from the phase detector arrangement to the control unit, the control unit is able to set the first number Z of the delay cells that are to be activated for delay.

One advantage of this delay locked loop is that the first number Z of the delay cells that are to be effectively connected for delay can be ascertained very rapidly. This is possible so rapidly because exclusively the phase angle of the input signal delayed by the various delay cells is to be compared with the first signal occurring downstream of the delay chain, therefore, very few clock cycles are necessary.

If, by way of example, the phase angle of the signal at the output of the tenth delay-effectively set delay cell from thirty overall delay-effectively set delay cells matches the first signal, then it is advantageously possible for twenty of the delay cells to be effectively connected for delay in further operation.

In one development, one of the plurality of phase detector cells of the phase detector arrangement has an output set up for outputting a signal which represents an item of relative phase information and which depends on a phase of the first signal present at the first node and a phase of a signal present at the output of the respective delay cell. It is thus advantageously possible for the matching of the phases or the difference between the phases of these two signals to be made available by the phase detector arrangement on the output side.

In one embodiment, the control unit is designed in such a way that a coarse setting of the delay time of the delay chain can be connected on account of the signals at the outputs of the phase detector cells. One advantage of this embodiment is that exclusively the three modules control unit, delay chain and phase detector arrangement are used for coarsely setting the delay time.

In one advantageous embodiment, the phase detector has the phase detector output, at which a signal can be tapped off, which signal outputs an item of relative phase information depending on the phase of the first signal present at the first node and a phase of the signal present at the delay chain.

The phase detector may be constructed like one of the plurality of phase detector cells. The phase detector is advantageously realized differently from the phase detector cells and designed to make available the relative phase information with a relatively high accuracy like one of the plurality of phase detector cells.

In one advantageous embodiment, the control unit is designed for finely setting the delay time of the delay chain. Signals that can be output by the control unit are set depending on the signal that can be tapped off at the phase detector output. In this embodiment, the delay chain is designed in such a way that the delay time can be finely set.

The first plurality of series-connected delay cells may be a third number N.

In one embodiment, the control unit is designed in a first operating state to effectively set a second number M of the delay cells for delay, so that the delay time of the delay chain is set to a first value. The second number M may be less than or equal to the third number N.

The control unit may be designed in a second operating state to activate the first number Z of the delay cells for delay, so that the delay time of the delay chain is coarsely set to a second value, which is less than the first value. One advantage of this embodiment is that in the first operating state, which may be provided such that it is very short, the second number M of the delay cells is actively connected in order to determine the first number Z of the delay cells that are to be actively connected in the second operating state, so that the phase angle of the signals to be synchronized is coarsely matching in the second operating state.

In the first operating state, a value for the second number M of the delay cells may be actively connected which may be significantly less than the third number N.

A value for the second number M less than the third number N may advantageously be set if a value for the first number Z of the delay cells that are to be effectively connected for delay is present at the control unit from a preceding setting process.

In one advantageous embodiment, a memory is provided for the first number Z determined in an earlier setting operation.

In one advantageous embodiment, the third number N of the delay cells of the delay chain is set up in such a way that even at the lowest operating frequency for which a device comprising this delay locked loop is specified, at least one edge of an input signal or of the delayed input signal is situated in the region of one of the delay cells of the delay chain in the first operating state. In the case of such an embodiment of the delay chain, at a higher operating frequency of the device, more than one edge of the input signal may be situated in the region of the delay cells of the delay chain.

If there are a plurality of input signals in the first operating state in the delay chain, then a first number Z and a further first number Z of the delay cells may be effectively settable for delay by the control unit. The control unit is advantageously designed in such a way that a lowest first number Z is set. One advantage of this embodiment is that the least distance between the delayed signal and the input signal for which synchronization is possible is thereby set.

The first output of the delay chain is connected to a data clock output of the component, often designated by DQS, via a path, the clock output serving for outputting a delayed signal.

The phase detector output may be directly connected to the input of the control unit via a line. The phase detector output is advantageously connected to the input of the control unit via a frequency-selective filter.

The filter may be a high-pass filter or a bandpass filter. In one advantageous embodiment, the filter is formed as a low-pass filter. One advantage of this embodiment is that the fluctuations in the delay time of the delay chain can thereby be kept small.

In one embodiment, the delay cells may be designed and constructed identically and also have the identical delay time. The first delay cell may be connected to the input of the delay chain at its input. An output of the first delay cell may be connected to an input of the second delay cell. The further delay cells may be connected in series analogously to this. An output of the last delay cell may be connected to the output of the delay chain. In this embodiment, the control unit may be designed for activating the first number Z of delay cells that are to be effectively connected at the start of the delay chain or for effectively connecting them at the end of the delay chain.

In one development, a fourth number of the delay cells is designed differently than a fifth number of the delay cells by virtue of the fact that the delay time to be activated of the fourth number of delay cells is longer than the delay time to be activated of the fifth number of delay cells. A coarse setting and a fine setting of the delay time can thus advantageously be carried out by the activation of mutually different delay cells.

In one embodiment of this development, the sum of the delay times of the fifth number of delay cells with a short delay time is greater than the long delay time of one of the cells of the fifth number. Some of the delay cells with a short delay time are advantageously activated during the first operating state.

In one embodiment, the first plurality of series-connected delay cells may be identical to the second plurality of phase detector cells. In another embodiment, it is possible to provide a value for the first plurality of series-connected delay cells which is greater than the second plurality of phase detector cells. In this embodiment, not every one of the delay cells is connected to a phase detector cell. In this embodiment, the phase detector arrangement enables a coarse setting of the delay time. A fine setting of the delay time may be connectable with the aid of the phase information made available by the phase detector. One advantage of this embodiment is that, as a result of this, a smaller area is required on the integrated component for the realization of the phase detector arrangement and a power consumption of the delay locked loop is reduced during operation.

A method for setting a delay chain includes: connecting, in a first operating state, a second number M of a first plurality of series-connected delay cells of a delay chain as effective for delay; tapping off of a second plurality of items of relative phase information at outputs of the second plurality of phase detector cells of a phase detector arrangement in the first operating state, the second plurality of items of relative phase information being formed depending on a phase of a first signal present at a first node, the first node being coupled to an output of the delay chain, and a phase of a signal present at an output of one of the first plurality of delay cells; and connecting, in a subsequent second operating state, a first number Z of a first plurality of delay cells as effective for delay, the first number Z being less than the second number M and the first number Z being determined from the second plurality of items of relative phase information in the first operating state.

Setting the delay chain is thus performed such that in the first operating state, the second number M of the delay cells which belong to the delay chain is set in a manner activated for delay. In the first operating state, the second plurality of items of relative phase information is obtained. The second plurality of items of relative phase information is output by the second plurality of phase detector cells which form the phase detector arrangement. The items of phase information are formed as a function of the phase of the first signal present at the first node, the first node being connected to the output of the delay chain, and the phase of the signal present at the output of the first plurality of delay cells.

In the subsequent second operating state, the method provides for setting the first number Z of delay cells as effective for delay. The first number Z is a function of the second plurality of items of relative phase information which are ascertained in the first operating state.

One advantage of the method is that the first number Z of the delay cells that are to be activated is determined in a first operating state which may be very short.

In one development, an item of relative phase information which is a function of the phase of the first signal present at the first node and the phase of the input signal present at the delay chain is ascertained via a phase detector. The delay chain is set depending on this relative phase information.

If it is ascertained via the phase detector that the phase of the first signal is leading the phase of the input signal, then it is possible in this embodiment to increase the first number Z of the delay cells activated for delay. If it is ascertained via the phase detector that the phase of the first signal is lagging relative to the phase of the input signal, then it is possible in this embodiment to reduce the first number Z of the delay cells to be activated for delay.

The delay cells may have identical delay times. In one development, a fourth number of the delay cells may have a shorter delay time than a fifth number of the delay cells. In this embodiment, it is advantageously possible, via the phase detector, to perform the setting of a number of the delay cells with the shorter delay time which are to be effectively set for delay, in order to obtain a fine setting of the delay chain.

In one exemplary embodiment, the control unit ascertains if the first number Z of the activated delay cells varies toward zero or toward a third number N, which is a number of the delay cells present. In this embodiment, it is possible to perform a renewed coarse setting of the delay cells to be activated. For this purpose, the component may be put into the first operating state.

In one advantageous development, a setting of one of the delay cells is performed if no edge of a signal is present at its input. A change in the setting is advantageously performed directly after an outputting of the delayed signal at the output of the delay cell.

The method thus provides for firstly effecting a coarse setting of a delay time which the delay cells activated for delay achieve overall as a sum. A fine setting of the delay time is effected directly afterward, so that the delay locked loop attains a settled state.

To summarize, the principle proposed has the following advantages:
  a fast setting of the delay time,
  an accurate setting of the delay time and, associated with this, an accurate synchronization of the signals to be synchronized,
  a setting of the delay time which reacts flexibly to the applied operating frequency of the integrated component,
  a tracking of the delay time during operation in order, by way of example, to adapt the delay time to a drift in the operating frequency,
  a delay locked loop which does not require an additional delay chain requiring further areas on the component for determining the delay cells to be activated.

The invention is explained in more detail below using a plurality of exemplary embodiments with reference to the figures. Functionally or operatively identical structural elements bear the same reference symbols.

DETAILED DESCRIPTION

Figure 1:
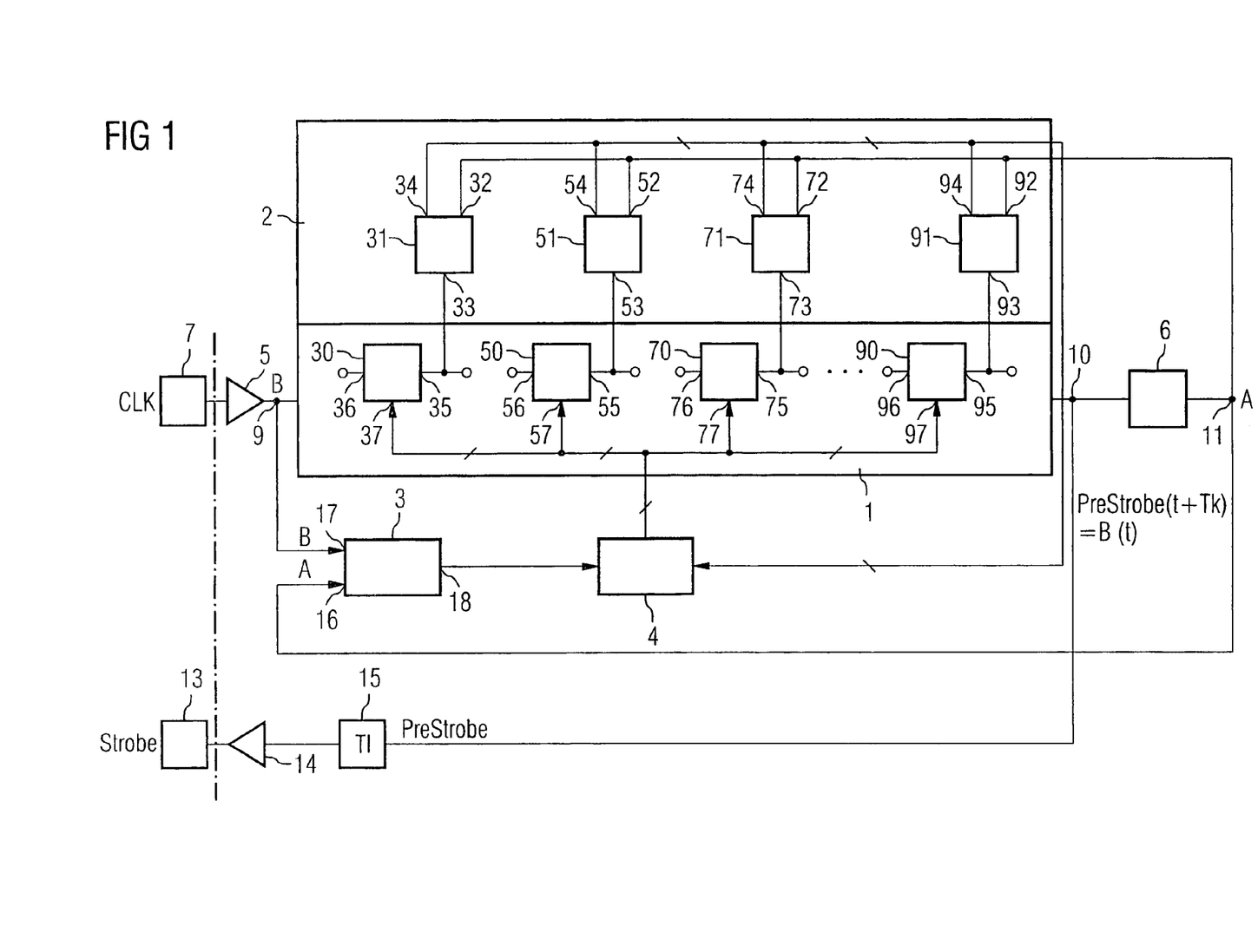
FIG. 1 shows an exemplary delay locked loop in accordance with the principle proposed.

FIG. 1 shows an exemplary embodiment of a delay locked loop in accordance with the principle proposed. The delay locked loop has a delay chain 1, a phase detector arrangement 2, a phase detector 3 and a control unit 4.

In this exemplary embodiment, the delay chain 1 has a first delay cell 30, a second delay cell 50, a third delay cell 70 and a last delay cell 90. The four delay cells 30, 50, 70, 90 include respective first inputs 36, 56, 76, 96 and outputs 35, 55, 75, 95. The delay cells 30, 50, 70, 90 are connected in series and respectively have control inputs 37, 57, 77, 97, at which the control unit 4 feeds control signals to the four delay cells 30, 50, 70, 90.

The phase detector arrangement 2 comprises four phase detector cells 31, 52, 72, 91 with respective second inputs 33, 53, 73, 93 that are connected to outputs 35, 55, 75, 95 of the delay cells 30, 50, 70, 90, respectively. The four phase detector cells 31, 52, 72, 91 are connected to a first node 11 at their respective first inputs 32, 52, 72, 92, with a first signal A being present at the first node.

The four phase detector cells 31, 51, 71, 91 are linked at their respective outputs 34, 54, 74, 94 to an input of the control unit 4 for outputting an item of relative phase information of the signals present at the respective first inputs 32, 52, 72, 92 and at the respective second inputs 33, 53, 73, 93 of the phase detector cells.

An output 10 of the delay chain 1 is coupled to the first node 11. This coupling may be a signal line. In another embodiment, this coupling may be realized by a delay element 6.

The delay chain 1, the phase detector arrangement 2, the phase detector 3 and the control unit 4 and also the delay element 6 may be connected to a reference potential terminal and to a voltage supply terminal for feeding in a supply voltage UC. For clarity, this is not illustrated in FIG. 1.

A signal PreStrobe can be tapped off at the output 10 of the delay chain 1. The signal PreStrobe may serve, e.g., in the case of a memory component such as random access memory (RAM), for providing data signals, that are correct in terms of phase, i.e., at the correct point in time, at data terminals of the memory component.

The signal PreStrobe is fed to the clock output 13 of the component via a path. The path may comprise a buffer 15 and an output driver 14 according to the embodiment in accordance with FIG. 1. In other exemplary embodiments, the path may comprise further circuit elements. Consequently, an output signal Strobe is present at the clock output 13.

A first phase detector input 16 of the phase detector 3 is connected to the first node 11 for feeding in the first signal A present at the first node 11.

An input 9 of the delay chain 1 is connected to a second phase detector input 17 for forwarding the input signal B present at the input 9 of the delay chain. The phase detector 3 is connected to the control unit 4 at a phase detector output 18. The phase detector 18 is designed for outputting an item of relative phase information between the signals at the first phase detector input 16 and the second phase detector input 17 and thus between the first signal A and the input signal B.

The clock input 7 is linked to the input 9 of the delay chain 1 via an input buffer 5. The input signal B can be tapped off at the input 9 of the delay chain 1. The input signal B present at the input 9 of the delay chain 1 is formed from the clock signal CLK present at the clock input 7. In one exemplary embodiment, the clock input 7 and the clock output 13 may be embodied as pads of an integrated component.

The signal PreStrobe is present at the output 10 of the delay chain 1, the PreStrobe signal at an instant t+Tk being identical to the input signal at the instant t.

A first signal A is present at the first node 11. The clock output 13 exhibits the output signal Strobe of the delay locked loop.

The delay chain 1 is thus fed the input signal B, which passes through the series-connected delay cells 30, 50, 70, 90. The phase detector cells 31, 51, 71, 91 serve for comparing the phase of the signal propagating in the delay chain 1 and the phase of the first signal A present at the first node 11.

If the delay cells 30, 50, 70, 90 are activated for delay in a first operating state, then the number of delay cells that are to be activated for delay in order to obtain synchronization can be read from a matching of the phase signals at one of the phase detector cells 31, 51, 71, 91.

In one embodiment, the further delay cells 30, 50, 70, 90 situated between the delay cell connected to the phase cell and the output of the delay chain 1 can be activated in a further operating state. In accordance with this embodiment, the delay cells which lie between the input 9 of the delay chain 1 and the delay cell to which the phase detector cell is connected at which the phase matching occurs can be connected as not effective for delay in the further operating state.

In another embodiment, instead of a first number Z of delay cells 50, 70, 90, which are to be activated, at the end of a delay chain 1, it is also possible to activate a first number Z of delay cells 30, 50, 70 at the start of the delay chain 1. In a further embodiment, it is possible to activate a selection of delay cells 30, 50, 70, 90 which are distributed over the delay chain 1. The following equation thus results:

$$Z \cdot DEL + TFB \approx x \cdot TCK$$

In this case, Z is the first number of the delay-activated delay cells 30, 50, 70, 90, DEL is a delay time achieved by one of the delay cells 115, 116, 117, 118, TFB is a delay time achieved by the delay element 6, X is a number of the cycles by which the output signal Strobe at the clock output 13 lags behind the clock signal CLK at the clock input 7, and TCK is a period duration of the clock signal CLK.

The equation has an approximately equals sign because the value of the first number Z only comprises integers since the first number Z is a number of the delay cells 30, 50, 70, 90 to be activated. A delay time Tk achieved by the delay chain 1 given a first number Z of activated delay cells 30, 50, 70, 90 is DEL * Z.

The delay time TFB achieved by the delay element 6 is to be set in such a way that it reproduces a delay caused by a data path. A data path may comprise a further input buffer 5 and a further output driver 14. In addition, a delay time caused by at least one buffer or by at least one signal line may also be taken into account in the definition of the delay time TFB.

The period duration of the clock signal CLK is equal to the period duration of the first signal A and of the delayed signal PreStrobe and of the output signal Strobe.

The number of delay cells that are to be activated in order to achieve synchronization can advantageously be identified very rapidly via the arrangement of the delay locked loop in accordance with FIG. 1.

Figure 2A:
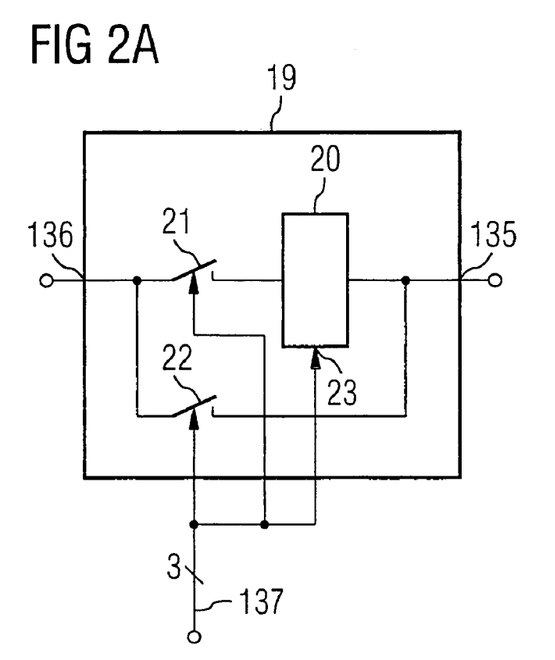
FIGS. 2A to 2D show exemplary delay cells and exemplary delay chains with delay cells.

FIG. 2A shows an exemplary embodiment of a semiconductor delay cell 19. The latter may be used as one of the plurality of delay cells 30, 50, 70, 90 of the delay chain 1 in FIG. 1. Functionally or operatively identical structural elements bear identical reference symbols.

The semiconductor delay cell 19 has an input 136 for feeding in a signal to be delayed and an output 135 for outputting the signal delayed by the semiconductor delay cell 19. The semiconductor delay cell 19 furthermore comprises a control input 137. The semiconductor delay cell 19 comprises a delaying circuit 20 and also two switches 21, 22.

The output 135 of the semiconductor delay cell 19 is connected to the input 136 of the semiconductor delay cell 19 via the switch 22. The output 135 is connected to the input 136 of the semiconductor delay cell 19 via a series circuit comprising the delaying circuit 20 and the switch 21.

If the switch 22 is closed, then the semiconductor delay cell 19 passes on the signal present at its input 136 to the output 135 of the semiconductor delay cell 19. For this purpose, the switch 21 is set to be open.

For activating the delay, the switch 21 is closed and the switch 22 is set to be open. The signal to be delayed that is present at the input 136 is then delayed by the delaying circuit 20 and can be tapped off at the output 135 of the semiconductor delay cell 19.

The control input 137 is connected to the two switches 21, 22. In one embodiment, the two switches 21, 22 are controlled by the control signal present at the control input 137. In this embodiment, the semiconductor delay cell 19 has a constant delay time.

It is advantageously possible, via the position of the switches 21, 22, for the semiconductor delay cell 19 to be activated for delay or not activated for delay.

In a further embodiment, an input 23 of the delaying circuit 20 is additionally connected to the control line. This serves for setting a delay time of the delaying circuit 20. In this advantageous embodiment, it is additionally possible for the delay time effected by the semiconductor delay cell 19 to be finely set.

Figure 2B:
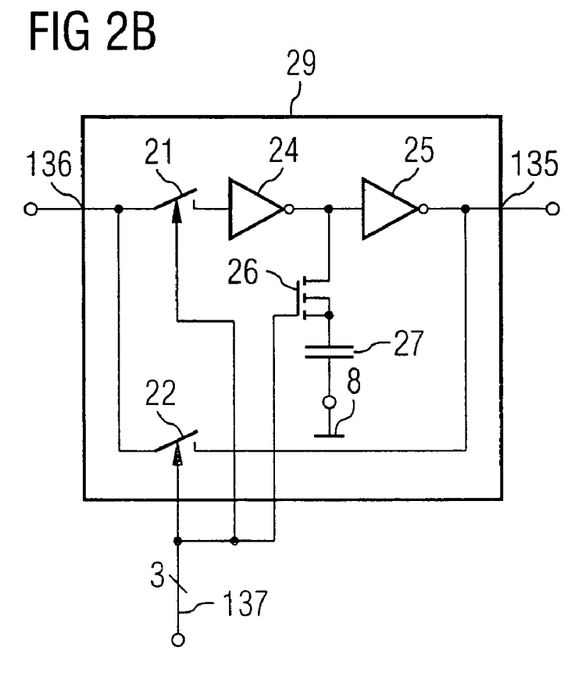

FIG. 2B shows a further exemplary embodiment of a semiconductor delay cell 29. It may be used as one of the plurality of delay elements 30, 50, 70, 90 of the delay chain 1 in FIG. 1.

The semiconductor delay cell 29 in accordance with FIG. 2B is constructed analogously to the semiconductor delay cell 19 in accordance with FIG. 2A, an exemplary embodiment of the delaying circuit 20 being embodied in FIG. 2B.

The delaying circuit 20 of the semiconductor delay cell 19 in FIG. 2A is replaced by two inverters 24, 25 in the semiconductor delay cell 29 in accordance with FIG. 2B. The signal present at an input 136 of the semiconductor delay cell 29 is fed via the switch 21 to the input of the inverter 24, the output of which is coupled to the input of the further inverter 25. The output of the latter is in turn connected to the output 135 of the semiconductor delay cell 29.

In one development, a node situated between the two inverters 24, 25 may be connected via a field effect transistor to a first electrode of a capacitor 27, the second electrode of which is connected to the reference potential terminal 8. In this case, the field effect transistor serves as a variable resistor.

The charging time of the capacitor 27 can be set by way of the setting of the resistance of the field effect transistor 26. The delay time of the semiconductor delay cell 29 can advantageously be set as a result.

Figure 2C:
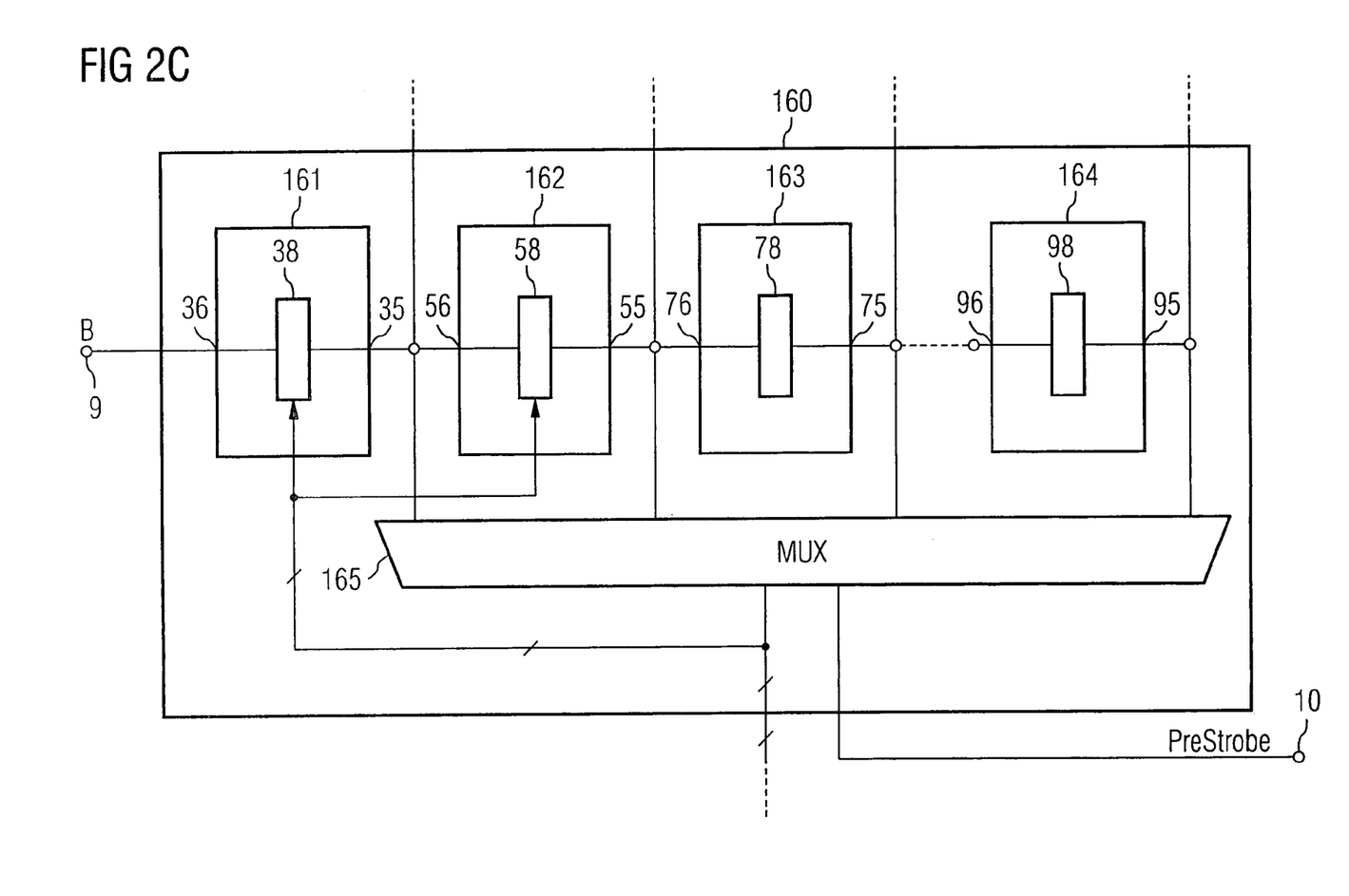

FIG. 2C shows an exemplary embodiment of a delaying arrangement 160. The delaying arrangement in FIG. 2C may be used as a delay chain 1 in FIG. 1.

The delaying arrangement 160 has four cells 161, 162, 163, 164 corresponding to the four delay cells 30, 50, 70, 90 of the delay chain 1 in accordance with FIG. 1. A cell 161 is connected to the input of the delay chain 9 at its first input 36. The input signal B is present at the input of the delay chain. The cell 161 is connected to a first input 56 of a cell 162 at its output 35. The cell 161 is likewise connected, at its output 35, to a second input of a first one of the phase detector cells 31, 51, 71, 91 of the phase detector arrangement 2, which is not shown in FIG. 2C. The cell 161 has the delaying circuit 38, which delays the signal present at the first input 36 of the cell 161 and makes it available at the output 35 of the cell 161. The cell 161 is connected to an input of a multiplexer 165 at its output 35.

The cells 162, 163 are linked to the preceding and succeeding cells and to the multiplexer 165 and the phase detector arrangement 2 in an analogous manner to that of cell 161.

The last cell 164 is connected to an output of a penultimate cell at its first input 96. The last cell 164 is connected to a second input of a phase detector cell and also to a further input of the multiplexer 165 at its output 95. It likewise has a delaying circuit 98 for delaying the signal present at its first input 96.

Consequently, the signals present at the outputs 35, 55, 75, 95 of the cells 161, 162, 163, 164 are fed to the multiplexer 165 on the input side. The output of the multiplexer is connected to the output 10 of the delay chain.

The signal B present at the input 9 of the delay chain passes through the various cells 161, 162, 163, 164 in the delaying arrangement 160 and is delayed in the process.

Depending on a control signal made available by the control unit 4, which is not shown in FIG. 2C, one of the outputs 35, 55, 75, 95 of the cells 161, 162, 163, 164 is selected in the multiplexer 165, so that the signal of this output 35, 55, 75, 95 is switched to the output of the multiplexer 165. The selected signal thus represents the signal PreStrobe present at the output 10 of the delay chain 1.

The multiplexer 165 serves for selecting the signal which can be tapped off as signal PreStrobe and can be made available to a component on which the delay locked loop is situated.

Depending on the control signal output by the control unit 4, a first number Z of the cells 161, 162, 163, 164 is effectively set for generating the signal PreStrobe. These are cells 161, 162, 163, 164 at the start of the delaying arrangement 160.

However, the further cells 161, 162, 163, 164 are likewise in operation and delay the signal present at their inputs. As a result, it is possible at any point in time, via the phase detector arrangement 2, to ascertain at which phase detector cell 31, 51, 71, 91, which, on the input side, is linked to one of the outputs 35, 55, 75, 95 of the cell 161, 162, 163, 164, the phase of the signal A present at the first node 11 matches the phase of the signal at the output 35, 55, 75, 95 of one of the cells 161, 162, 163, 164.

Consequently, it is advantageously possible to determine at any point in time, which new value Z is to be set. This is advantageous primarily when the first number Z approximates to the value zero or the value N, which is a number of the cells 161, 162, 163, 164 present overall.

In one development, at least one of the cells 161, 162, 163, 164 may be designed for setting the delay time in fine gradations. The delaying circuit 20 of the at least one cell 161, 162, 163, 164 is driven via a signal line by the control unit 4. The delay time can thus advantageously be finely set.

Figure 2D:
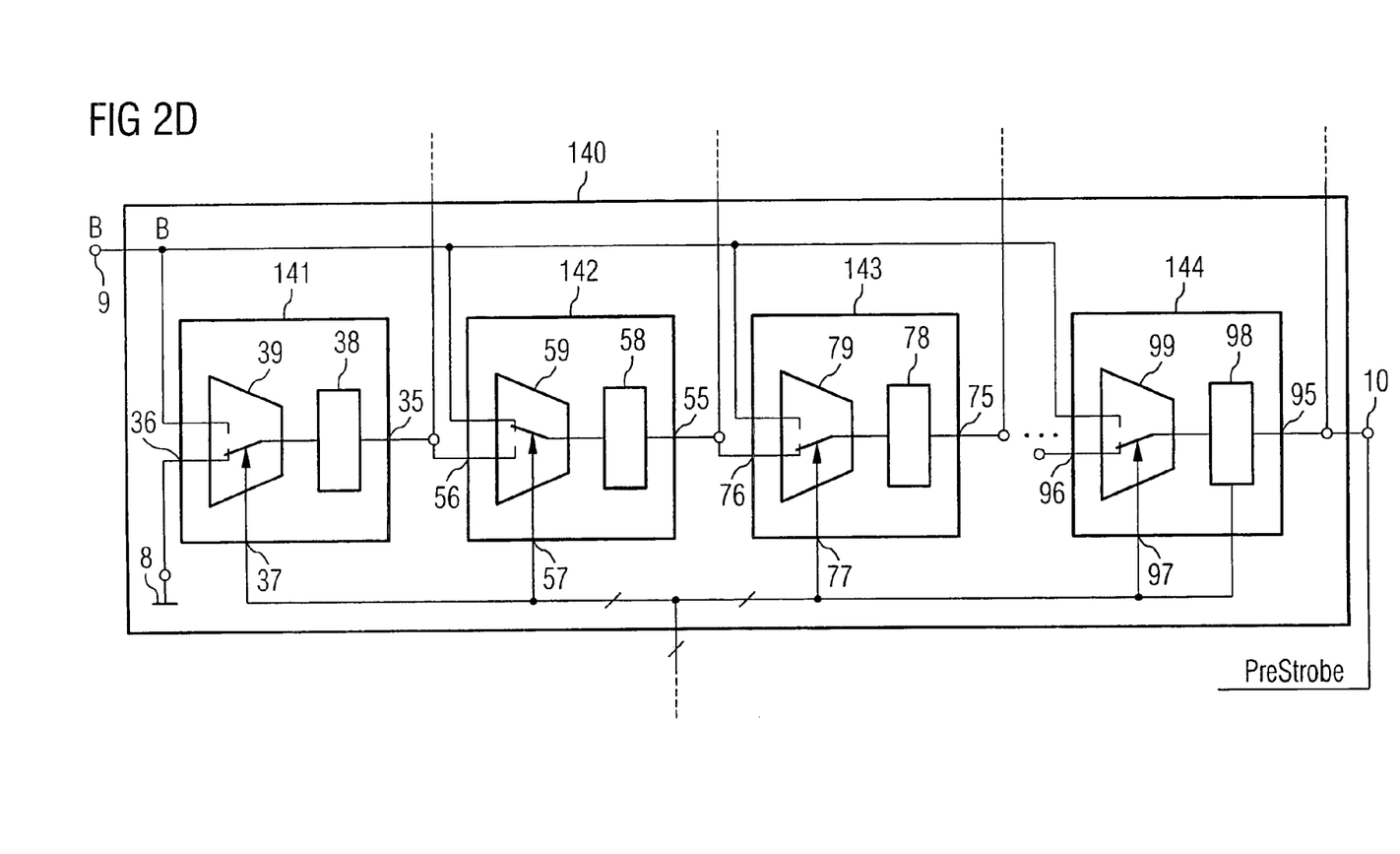

FIG. 2D shows a further exemplary embodiment of a delaying arrangement 140. The latter may be used as the delay chain 1 in FIG. 1.

In this exemplary illustration, the delaying arrangement 140 comprises four cells 141, 142, 143, 144 corresponding to the delay cells 30, 50, 70, 90 of the delay chain 1 in accordance with FIG. 1. The cells 141, 142, 143, 144 each have a multiplexer 39, 59, 79, 99 the output of which is connected to the input of the delaying circuit 38, 58, 78, 98, which, in one embodiment, may be the delaying circuit 20 in accordance with FIG. 2A or 2B. The output of the delaying circuit 38, 58, 78, 98 is connected to the output 35, 55, 75, 95 of the cell 141, 142, 143, 144, which is coupled to the second input of one of the phase detector cells 31, 51, 71, 91, of the phase detector arrangement 2, which is not shown in FIG. 2D, and also to a first input 56, 76, 96 of the succeeding cell 142, 143, 144. The first input of the cells 141, 142, 143, 144 is connected to a first input of the respective multiplexer 39, 59, 79, 99.

The input signal B can be fed to the delaying arrangement 140 at its input 9. The signal B is fed to the cells 141, 142, 143, 144 in each case at their second input, which is connected to a second input of the multiplexer 39, 59, 79, 99.

The first input 36 of the cell 141 is terminated in a suitable manner. This may be carried out for example via a connection to the reference potential terminal 8.

The output 95 of the last cell 144 is linked to the output 10 of the delay chain. The signal PreStrobe is made available by the delaying arrangement 140 at said output 10 of the delay chain. The multiplexers 39, 59, 79, 99 are connected via signal lines to the control unit 4, which is not illustrated in this FIG. 2D.

Depending on the control signals, in one of the multiplexers 39, 59, 79, 99, the signal B of the second input is connected to the output of the multiplexer. In all the other multiplexers 39, 59, 79, 99, the first input of the cell 141, 142, 143, 144 or of the multiplexer 39, 59, 79, 99 is linked to the output of the multiplexer 39, 59, 79, 99. What is thus achieved is that the input signal B which is intended to be delayed is forwarded in the case of one of the cells 141, 142, 143, 144. The signal is furthermore passed on and delayed through the subsequent cells as far as the last cell 144, so that it is available as signal PreStrobe at the output 10 of the delaying arrangement 140.

In the delaying arrangement 140, the last cells are thus advantageously activated for delay.

In one development, at least one of the delaying circuits 38, 58, 78, 98 may advantageously be linked to the control unit 4 for more finely setting the delay time Tk.

Figure 3A:
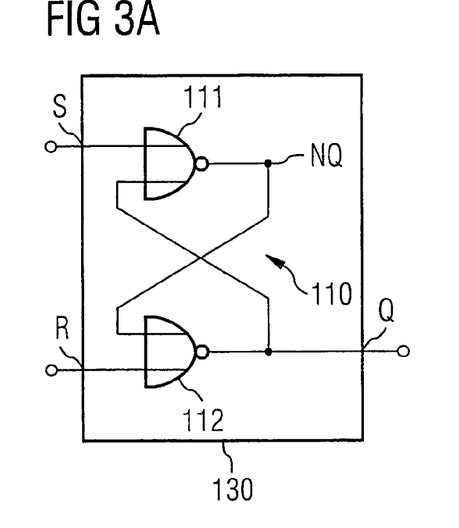
FIGS. 3A to 3C show exemplary phase detectors.
Figure 3B:
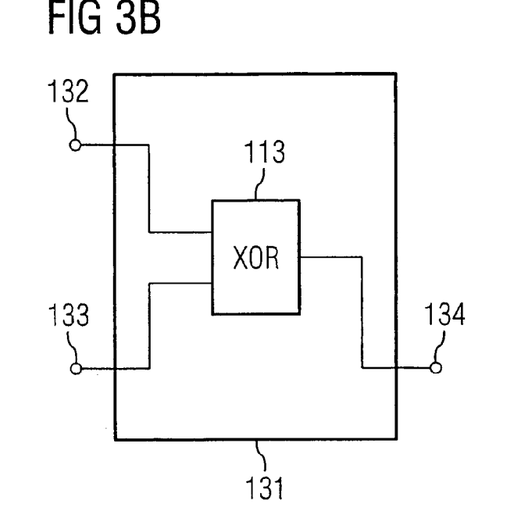
Figure 3C:
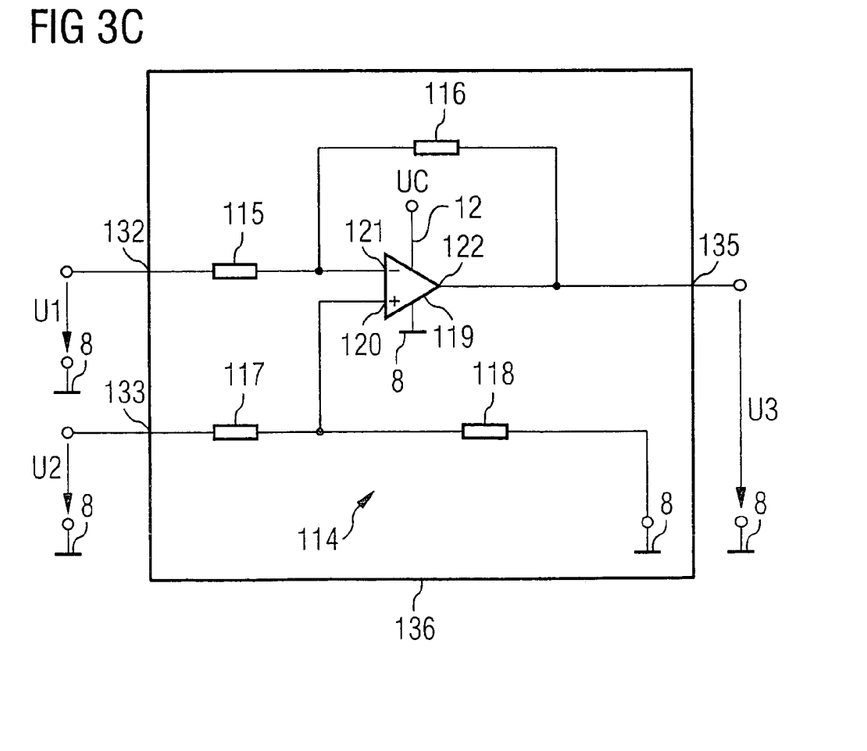

FIG. 3A to 3C show exemplary embodiments of a phase detector device 130, 131, 136 as may be used as phase detector 3 or as phase detector cell 31, 51, 71, 91 in the phase detector arrangement 2 in FIG. 1.

FIG. 3A shows the phase detector device 130, which comprises a flip-flop 110. The phase detector device 130 furthermore comprises a set input S and a reset input R and also an output Q. The set input S and the reset input R may be used as a first input and a second input, respectively, of a phase detector 3 or of a phase detector cell 31, 51, 71. 91. The output Q of the phase detector device 130 may be used as output 34, 54, 74, 94 of the phase detector cells 31, 51, 71, 91 or as phase detector output 18 of the phase detector 3.

FIG. 3B shows a phase detector device 131, which may be used as one of the phase detector cells 31, 51, 71, 91 of the phase detector arrangement 2 or as the phase detector 3 in FIG. 1.

The phase detector device 131 comprises an exclusive-OR gate 113, abbreviated to XOR, and also two inputs 132, 133 and an output 134. The two inputs 132, 133 may be used as first and, respectively, second input 32, 52, 72, 92 and 33, 53, 73, 93 of the phase detector cells 31, 51, 71, 91 or as first phase detector input 16 and second phase detector input 17 of the phase detector 3 in accordance with FIG. 1. The output 134 of the phase detector device 131 may likewise be used as one of the outputs 34, 54, 74, 94 of the phase detector cells 31, 51, 71, 91 of the phase detector arrangement 2 or as phase detector output 18 of the phase detector 3 in FIG. 1.

The exclusive-OR gate 113 connects the output 134 to the two inputs 132 and 133 of the phase detector device 131. The output 134 of the phase detector device 131 has a value 1 exclusively when either exclusively the input 132 has a signal 1 applied to it or exclusively the input 133 has a signal 1 applied to it.

It is thus advantageously possible, in the case of a realization of one of the phase detector cells 31, 51, 71, 91 of the phase detector arrangement 2 in the form of the phase detector device 131, to determine which output 35, 55, 75, 95 of one of the delay cells 30, 50, 70, 90 of the delay chain 1, which is not shown in FIG. 3B, has a signal 1 at the same time as the first signal A which can be tapped off at the first node 11 has a signal 1. In this case, the output 134 of the phase detector device 131 has the value 0.

FIG. 3C shows a phase detector device 136, which may be used as one of the phase detector cells 31, 51, 71, 91 or the phase detector 3 in the delay locked loop in accordance with FIG. 1.

The phase-detector device 136 comprises a comparator 114. The comparator 114 has an amplifier 119 and four resistors 115, 116, 117, 118.

An input 132 of the phase detector device 136 is connected to the inverting input 121 of the amplifier 119 via the resistor 115. The output 135 of the phase detector cell device 136 is likewise connected to an output 122 of the amplifier 119. The output 122 of the amplifier 119 is connected to the inverting input 121 of the amplifier 119 via the resistor 116.

A further input 133 of the phase detector device 136 is connected to a noninverting input 120 of the amplifier 119 via the resistor 117. The noninverting input 120 of the amplifier 119 is connected to the reference potential terminal 8 via a resistor 118. The amplifier 119 is connected to the reference potential terminal 8 and the voltage supply terminal 12 for feeding in a supply voltage UC.

A voltage U3 that can be tapped off at the output 135 of the phase detector device 136 is a function of the four resistors 115, 116, 117, 118 and a voltage U1 fed in at the input 132, and a voltage U2 fed in at the input 133 of the phase detector device 136. If the two resistors 115, 117 have the same resistance and if the two resistors 116 and 118 have the same resistance, then the voltage U3 which can be tapped off at the output 135 of the phase detector device 136 is equal to the difference between the value of the voltage U2 and the value of the voltage U1 multiplied by the resistance ratio of the value of the resistor 118 to the value of the resistor 117.

Consequently, it is possible, via the voltage U3, to ascertain which of the two voltages at the two inputs 132, 133 of the phase detector device 136 is greater.

The relative phase angle of the voltage U1 with respect to the voltage U2 can advantageously be determined very accurately from this.

| Reference symbols | |
|---|---|
| 1 | Delay chain |
| 2 | Phase detector arrangement |
| 3 | Phase detector |
| 4 | Control unit |
| 5 | Input buffer |
| 6 | Delay element |
| 7 | Clock input |
| 8 | Reference potential terminal |
| 9 | Input of the delay chain |
| 10 | Output of the delay chain |
| 11 | First node |
| 12 | Voltage supply terminal |
| 13 | Clock output |
| 14 | Output driver |
| 15 | Buffer |
| 16 | First phase detector input |
| 17 | Second phase detector input |
| 18 | Phase detector output |
| 19, 29 | Semiconductor delay cell |
| 20 | Delaying circuit |
| 21, 22 | Switch |
| 23 | Control input for fine setting |
| 24, 25 | Inverter |
| 26 | Field effect transistor |
| 27 | Capacitor |
| 30 | First delay cell |
| 31 | First phase detector cell |
| 50 | Second delay cell |
| 51 | Second phase detector cell |
| 70 | Third delay cell |
| 71 | Third phase detector cell |
| 90 | Last delay cell |
| 91 | Last phase detector cell |
| 32, 52, 72, 92 | First input |
| 33, 53, 73, 93 | Second input |
| 34, 54, 74, 94 | Output |
| 35, 55, 75, 95, 135, 155 | Output |
| 36, 56, 76, 96, 136, 156 | Input |
| 37, 57, 77, 97, 137, 157 | Control input |
| 38, 58, 78, 98 | Delay circuit |
| 39, 59, 79, 99 | Multiplexer |
| 110 | Flip-flop |
| 111, 112 | NOR gate |
| 113 | Exclusive-OR gate |
| 114 | Comparator |
| 115, 116, 117, 118 | Resistor |
| 119 | Amplifier |
| 120, 121 | Input of the amplifier |
| 122 | Output of the amplifier |
| 123 | Filter |
| 130, 131, 136 | Phase detector device |
| 132, 133 | Input |
| 134 | Output |
| 140, 160 | Delaying arrangement |
| 141, 142, 143, 144 | Cell |
| 165 | Multiplexer |
| 161, 162, 163, 164 | Cell |
| A | First signal |
| B | Input signal |
| CLK | Clock signal |

-continued

| Reference symbols | |
|---|---|
| PreStrobe | Delayed signal |
| Q | Output |
| R | Reset input |
| S | Set input |
| Strobe | Output signal |
| Tk | Delay time |
| UC | Supply voltage |
| U1, U2, U3 | Voltage |

What is claimed is:

1. A delay locked loop, comprising:
a delay chain comprising a plurality of series-connected delay cells, the delay chain receiving an input signal and generating at an output an output signal that is delayed by a delay time introduced by the delay cells, the output being coupled to a first node at which a first signal is present;
a phase detector arrangement comprising a plurality of phase detector cells that receive the first signal and an output of a respective one of the delay cells; and
a control unit responsive to outputs of the phase detector cells to generate a control signal for setting the delay time of the delay chain such that a selected first number of the delay cells is activated for delay.

2. The delay locked loop according to claim 1, wherein the outputs of the phase detector cells contain relative phase information based on a relative phase of the first signal and the output of the respective one of the delay cells.

3. The delay locked loop according to claim 2, wherein at least one of the phase detector cells comprises a flip-flop, an exclusive-OR gate or a comparator.

4. The delay locked loop according to claim 1, wherein the control unit coarsely sets the delay time of the delay chain based on the outputs of the phase detector cells.

5. The delay locked loop according to claim 4, wherein:
in a first operating state, the control unit sets the delay time of the delay chain to a first value by effectively connecting for delay a second selected number of delay cells; and
in a second operating state, the control unit coarsely sets the delay time of the delay chain to a second value, which is less than the first value, by effectively connecting for delay said first selected number of delay cells.

6. The delay locked loop according to claim 3, wherein at least one of the delay cells comprises: a first input for receiving a signal to be delayed; a delay circuit for delaying the signal to be delayed; and an output for outputting a delayed signal.

7. The delay locked loop according to claim 6, further comprising a multiplexer driven by the control unit and operable to connect an output of one of the delay cells to the output of the delay chain.

8. The delay locked loop according to claim 6, wherein each of the delay cells comprises a multiplexer controlled by the control signal and includes first and second inputs, the first input of each multiplexer other than the multiplexer of a first of the delay cells receiving an output of an upstream delay cell, the second input of each multiplexer receiving said input signal, and an output of a last of the delay cells being coupled to the output of the delay chain, wherein the control circuit controls the multiplexer of one of the delay cells to supply said input signal to the delay circuit of the delay cell and controls the multiplexer of others of the delay cells to supply the output of the upstream delay cell to the delay circuit of the delay cell.

9. The delay locked loop according to claim 6, wherein the delay circuit of at least a first of the delay cells introduces a first delay time, and the delay circuit of at least a second of the delay cells introduces a second delay time that is significantly less than the first delay time.

10. The delay locked loop according to claim 1, further comprising a delay element that couples the output of the delay chain to the first node.

11. The delay locked loop according to claim 10, further comprising a data path comprising: an input buffer, an output buffer, signal lines, and an output driver cell, wherein the delay element has a delay time that is a function of a delay of the data path.

12. The delay locked loop according to claim 1, further comprising an input buffer for receiving a clock signal and supplying the input signal to the delay chain.

13. The delay locked loop according to claim 1, further comprising a clock output coupled to the output of the delay chain via a signal path, the clock output supplying a delayed signal.

14. The delay locked loop according to claim 13, wherein the signal path comprises at least one signal line, at least one buffer, and an output driver.

15. The delay locked loop according to claim 1, further comprising a phase detector that receives the input signal and the first signal and supplies a phase detector output signal to the control unit.

16. The delay locked loop according to claim 15, wherein the phase detector output signal provides relative phase information based on a phase of the first signal and a phase of the input signal.

17. The delay locked loop according to claim 15, wherein the delay chain comprises a circuit that finely sets the delay time of the delay chain as a function the phase detector output signal.

18. The delay locked loop according to claim 15, wherein the phase detector comprises at least one of: a flip-flop, an exclusive-OR gate, and a comparator.

19. The delay locked loop according to claim 15, wherein the control unit comprises a frequency selective filter for receiving the phase detector output signal.

20. A delay locked loop, comprising:
means for delaying an input signal, comprising a plurality of series-connected delay cells;
means for phase detection comprising a plurality of phase detector cells respectively coupled to the delay cells; and
means for controlling a delay time of the means for delaying, in response to an output of the means for phase detection;
wherein each of phase detector cells includes a first input coupled to a first node that is connected downstream of an output of the means for delaying, and a second input coupled to an output of a respective one of the delay cells.

21. The delay locked loop according to claim 20, further comprising:
a phase detector that receives the input signal and a signal from the first node, and supplies a phase detector output signal to the means for controlling.

22. The delay locked loop according to claim 21, wherein an output of the means for delaying is coupled to the first node.

23. The delay locked loop according to claim 20, wherein the means for controlling activates a selected number of the delay cells for generating a selected delay.

24. In a delay locked loop comprising a delay chain of a plurality of series-connected delay cells, and a phase detector arrangement including a respective plurality of phase detector cells responsive to outputs of the delay cells, a method for setting a delay time of the delay chain, comprising:
- activating a first selected number of the delay cells in response to relative phase information generated by the phase detector cells; and
- supplying an input signal to the delay chain and generating an output signal that is delayed by a delay time as a function of the first selected number of delay cells.

25. The method according to claim 24, further comprising:
- activating, in a first operating state, a second selected number of the delay cells; and
- activating, in a subsequent second operating state, the first selected number of the delay cells, wherein the first selected number is less than the second selected number.

26. The method according to claim 25, wherein each phase detector cell generates the relative phase information from an output of a respective delay cell and a signal received from a first node downstream of the delay chain.

27. In a delay locked loop comprising a delay chain of a plurality of series-connected delay cells, and a phase detector arrangement including a respective plurality of phase detector cells responsive to outputs of the delay cells, a method for setting a delay time of the delay chain, comprising:
- activating, in a first operating state, a second selected number of the delay cells;
- generating, in the first operating state, relative phase information from each phase detector cell based on an output of a respective delay cell and a signal received from a first node downstream of the delay chain; and
- activating, in a subsequent second operating state, a first selected number of the delay cells based on the relative phase information, wherein the first selected number is less than the second selected number.

28. The method according to claim 27, further comprising:
- determining an item of relative phase information via a phase detector depending on a phase of the signal received from the first node and a phase of an input signal supplied to the delay chain; and
- setting a delay time of the delay chain based on the item of relative phase information.

29. A delay locked loop, comprising:
- means for delaying an input signal, comprising a plurality of series-connected delay cells;
- means for phase detection comprising a plurality of phase detector cells respectively coupled to the delay cells; and
- means for controlling a delay time of the means for delaying, in response to an output of the means for phase detection, wherein the means for controlling activates a selected number of the delay cells for generating a selected delay.

* * * * *